United States Patent [19]
Yoneda

[11] Patent Number: 5,305,262
[45] Date of Patent: Apr. 19, 1994

[54] SEMICONDUCTOR INTEGRATED CIRCUIT
[75] Inventor: Masato Yoneda, Tokyo, Japan
[73] Assignee: Kawasaki Steel Corporation, Hyogo, Japan
[21] Appl. No.: 942,469
[22] Filed: Sep. 9, 1992
[30] Foreign Application Priority Data Sep. 11, 1991 [JP] Japan .................................. 3-231986
Jan. 10, 1992 [JP] Japan .................................. 4-003403

[51] Int. Cl.$^5$ ............................................. G11C 15/04
[52] U.S. Cl. .................................. 365/189.05; 365/49; 365/154; 365/190
[58] Field of Search ...................... 365/189.05, 49, 154, 365/156, 185, 190, 230.01, 207, 210

[56] References Cited
U.S. PATENT DOCUMENTS

| | | | |
|---|---|---|---|
| 3,701,980 | 10/1972 | Mundy | 340/173 AM |
| 5,051,949 | 9/1991 | Young | 365/49 |
| 5,111,427 | 5/1992 | Kobayashi et al. | 365/49 |
| 5,126,968 | 6/1992 | Hamamoto et al. | 365/239.01 |

FOREIGN PATENT DOCUMENTS

| | | | |
|---|---|---|---|
| 0233453 | 8/1987 | European Pat. Off. | 365/49 |
| 60-236193 | 11/1985 | Japan | 365/49 |
| 1-194196 | 4/1989 | Japan . | |

OTHER PUBLICATIONS

IEEE Journal of Solid-State Circuit, vol. SL-8, No. 5 Oct. 1973 Gunnar Carlstedt.
"Design of CMOS VLSI", pp. 167-169 and 176-177, edited by Tetsuya Iizuka and Supervised by Takuo Sugano, Baifukan, 1989.

*Primary Examiner*—Eugene R. LaRoche
*Assistant Examiner*—Tan Nguyen
*Attorney, Agent, or Firm*—Oliff & Berridge

[57] ABSTRACT

A semiconductor integrated circuit has a CAM structure based on nonvolatile memories which is used for forming a flexible CAM of large scale integration. The circuit includes a first memory cell for defining the electrical connection or the nonconnection between a first data line and a match line, a second memory cell for defining the electrical nonconnection or the connection between a second data line and the match line, and a selective transistor for making or breaking the connection between each of the first and the second data lines and the match line. The threshold voltage of the selective transistor has a predetermined value incorporated during the fabrication process. The semiconductor integrated circuit can electrically connect a selective word line connected to a gate electrode of the selective transistor to the match line and has a tri-state buffer for making the potential of the selective word line float. The threshold voltage of each nonvolatile memory is set at a predetermined voltage. The semiconductor integrated circuit is capable of retrieving data from a plurality of memory cells at high speed without mutual interference and is able to provide an associative memory unit for use as a high-speed, large capacity data base.

17 Claims, 7 Drawing Sheets

SEMICONDUCTOR INTEGRATED CIRCUIT

BACKGROUND OF THE INVENTION

The present invention relates to CAM (Content Addressable Memory) and more particularly to a semiconductor integrated circuit having a CAM structure comprising newly formed cells based on a nonvolatile memory element.

Heretofore, fully parallel CAMs (Content Addressable Memories), which are also called associative memories, have been widely known as semiconductor memory circuits having the functions of performing the match (or coincident) detection of between retrieval data and stored data concurrently in terms of all bits and outputting the match address of stored data or stored data (see "Design of CMOS VLSI," pp 176-177, edited by Tetsuya Iizuka and supervised by Takuo Sugano, Baifukan, 1989).

However, the bitwise configuration of a typical conventional CAM comprising SRAM cells and exclusive NOR circuits has made it impossible to provide CAM having a large-sized cell and consequently a capacity at a level fit for practical use.

In many IC cards that have recently been commercialized as personal data bases, for instance, no CAM has been arranged as stated above. In such an IC card, an arrangement has been made to find out data for the intended purpose by sequentially retrieving data one after another from ROM (Read Only Memory) in which the data are prestored. For this reason, the greater the number of data becomes, as in language dictionaries such as Japanese and English-Japanese dictionaries, the more it requires time to retrieve data. In other words, what has high-speed, flexible retrieval functions is still nonexistent.

If all data are made retrievable at a time as in the case of CAM, not by retrieving data one by one with the aid of software from the conventional ROM and the like in the prior art as stated above, data retrieval from the IC card equipped with a large memory capacity may be implemented with flexibility at high speed.

U.S. Pat. No. 3,701,980 (October 1972) and Japanese Patent Laid-Open No. 194196/1989, for instance, suggest the possibility of large capacity associative memories. The former U.S. patent is based on DRAM having a CAM cell structure with ordinary 2-bit memories as one set, whereas the latter is based on an EPROM nonvolatile memory, also forming CAM having one set of ordinary 2-bit EPROM memories. Consequently, both can be subjected to integration larger in scale than that of CAM based on SRAM.

Notwithstanding, what is based on DRAM disclosed in U.S. Pat. No. 3,701,980 still poses a problem in view of its area size. In the case of the associative memory based on EPROM as a nonvolatile memory, which is disclosed in Japanese Patent laid-open No. 194196/1989, flexible write/read is impossible in that EPROM with two bits as one set is structurally employed to make ground lines for common use match lines and that no attentive consideration has been given to particulars of retrieval operation.

BRIEF SUMMARY OF THE INVENTION

In view of the foregoing problems, it is an object of the present invention to provide a semiconductor integrated circuit having an associative memory structure capable of retrieving data from a number of memory cells without mutual interference at high speed and making it possible to build a large capacity data base at higher speed.

The present inventors have arduously made studies in associative memories for use as nonvolatile memories with two bits as one set to accomplish the object stated above and found that the prior art CAM structure has the following drawbacks.

In the case of the CAM structure disclosed in Japanese Patent Laid-Open No. 194196/1989, (1) the potential of low "0" data collides with that of high "1" data via a match line for common use when a mixture of match and mismatch cells exists at the time of retrieval operation and no operation is guaranteed.

Moreover, (2) the higher the integration, the greater the number of memories becomes, and an extremely large current is caused to flow because a mixture of match and mismatch cells tends to grow in number.

The present invention is based on the knowledge acquired above by the present inventors.

There is provided by its first aspect of the present invention a semiconductor integrated circuit comprising a first memory cell for defining the electrical connection or the nonconnection between a first data line and a match line, a second memory cell for defining the electrical nonconnection or the connection between a second data line and said match line, and selective transistors for making and breaking the connection between each of said first and said second data lines and said match line in accordance with the definition of the connections of said first and second memory cells, wherein the threshold voltage of said selective transistor has a predetermined value incorporated during the fabrication process.

Preferably, a sense amplifier of a current driving type is connected to said match line and wherein a gate voltage Vw of said selective transistor satisfies the following conditions at the time of retrieval operation:

$$V_t \leq V_W \leq V_S + V_t$$

where
$V_t$: threshold voltage of the selective transistor (at the time of 0 V substrate bias);
$V_S$: potential of the match line at the time of retrieval operation;
$V_{t'}$: threshold voltage of the selective transistor subjected to substrate bias at the time of retrieval operation.

Preferably, said semiconductor integrated circuit further comprises a plurality of retrieval memory word blocks, said block including a set of said first and second memory cells, said selective transistors and a selective word line for controlling said selective transistors, said match line and said sense amplifier are commonly used for said plurality of retrieval memory word blocks.

There is provided by its second aspect of the present invention a semiconductor integrated circuit comprising a first memory cell for defining the electrical connection or the nonconnection between a first data line and a match line, a second memory cell for defining the electrical nonconnection or the connection between a second data line and said match line, a selective transistor for making and breaking the connection between each of said first and said second data lines and said match line in accordance with the definition of the connections of said first and second memory cells, means for electrically connecting a selective word line connected to the gate electrode of said selective transistor to said match line, and means for making said selective word line afloat.

Preferably, the threshold voltage of said selective transistor has a predetermined value incorporated during the fabrication process.

Preferably, a gate voltage $V_w$ of said selective transistor satisfies the following conditions at the time of retrieval operation:

$$V_t \leq V_w \leq V_H + V_{t'}$$

where $V_t$: threshold voltage of the selective transistor (at the time of 0V substrate bias);

$V_H$: H (high) potential of the data line at the time of retrieval operation;

$V_{t'}$: threshold voltage of the selective transistor subjected to substrate bias at the time of retrieval operation.

Preferably, said semiconductor integrated circuit further comprises a plurality of retrieval memory word blocks, said blocks including a set of said first and second memory cells, said selective transistors and a selective word line for controlling said selective transistors, said match line and a potential detecting means for detecting an electric potential of the match line are commonly used for said plurality of retrieval memory word blocks.

Preferably, in each aspect, the voltage Vt (at the time of 0V substrate bias) at the value incorporated in said selective transistor is set higher than that of any peripheral circuit.

Preferably, in each aspect, said memory cells are composed of a nonvolatile memory element.

Preferably, in each aspect, said nonvolatile memory element is a MONOS-type nonvolatile memory element.

There is provided by its third aspect of the present invention a semiconductor integrated circuit comprising a first nonvolatile memory cell for defining the electrical connection or the nonconnection between a first data line and a match line, a second nonvolatile memory cell for defining the electrical nonconnection or the connection between a second data line and said match line, and a selective word line for controlling said first and second nonvolatile memory cells, said first and second nonvolatile cells and said control word line being combined into a retrieval memory word block, wherein the voltage of each signal line and the threshold voltage of each nonvolatile memory cell are so arranged as to satisfy the following equations (I) and (II) simultaneously at the time of data retrieval operation:

$$V_w - V_H < V_{tL} < V_w - V_L < V_L < V_{tH} \qquad (I)$$

$$V_w - V_S < V_{tL} \qquad (II)$$

where $V_{tL}$: low threshold voltage of the nonvolatile memory cell;

$V_{tH}$: high threshold voltage of the nonvolatile memory cell;

$V_W$: potential of the selective word line at the time of retrieval operation;

$V_H$: H(high) potential of the data line at the time of retrieval operation;

$V_L$: L(low) potential of the data line at the time of retrieval operation;

$V_S$: potential of a match line at the time of retrieval operation.

Preferably, said nonvolatile memory cell is formed with a nonvolatile transistor having a threshold voltage satisfying said equations (I) and (II).

Preferably, said semiconductor integrated circuit further comprising means for setting the voltage at the time of retrieval operation so that it can satisfy said equations (I) and (II) simultaneously.

Preferably, said nonvolatile memory element is at least one selected from the group consisting of mask ROM, EPROM, EEPROM and UVEPROM.

Preferably, said match line and a potential detecting means for detecting an electric potential of the match line are commonly used for a plurality of said retrieval memory word blocks.

DETAILED DESCRIPTION OF THE INVENTION

A description will subsequently be given of a semiconductor integrated circuit having a CAM structure according to the present invention.

In a semiconductor integrated circuit in a first aspect of the present invention, the threshold voltage of a selective transistor for selecting each memory cell is to be set at a predetermined value during the course of fabrication process.

Therefore, the gate voltage of the selective transistor is controlled in that it is set within the predetermined range restricted by the threshold voltage thus incorporated so that the through current between the match cell and the mismatch cell at the time of retrieval operation may be suppressed.

In a semiconductor integrated circuit in a second aspect of the present invention, a match line and a selective word line which is connected to the gate electrode of the selective transistor of each memory cell are electrically connected via a connection means and the selective word line is set to float so that the through current between the match cell and the mismatch cell at the time of retrieval operation may be suppressed. In the case where the threshold voltage of the selective transistor is to be set at a predetermined value during the course of fabricatiion process, the aforementioned through current is suppressed further by controlling the gate voltage of the selective transistor such that it is set within the predetermined range.

In a semiconductor integrated circuit in a third aspect, a first nonvolatile memory cell defining the electrical connection or nonconnection between a first data line and a match line and a second nonvolatile memory cell defining the electrical connection or nonconnection between a second data line and said match line are controlled by a selective word line in a set of retrieval memory word blocks. On the other hand, the relation among the voltages applied to signal lines such as the first and second data lines, the voltage of the match line, the voltage of the selective word line and the threshold voltages of the first and second nonvolatile memories is regulated to satisfy the aforementioned equations (I) and (II).

Consequently, even when many retrieval memory word blocks are connected to one selective word line, it is therefore possible to connect one of the first and second data lines to the match line in conformity with the condition in which the connections between the first nonvolatile memory cell and the match line, and between the second nonvolatile memory cell and the match line are controlled by the selective word line only in a block exhibiting the mismatch between the reference data and the memory data.

By detecting the potential of the match line with a sense amplifier connected thereto, the retrieval result of each block is obtainable. Consequently, the electrical collision between blocks can be eliminated even though there exist both retrieval memory word blocks which do or do not accord with reference data in a plurality of retrieval memory word blocks controlled by the same selective word line. The retrieval result with extremely high precision together with extremely high memory selection freedom becomes obtainable.

Referring to the accompanying drawings, a description will be given of the preferred embodiment of the present invention in the form of a semiconductor integrated circuit having an associative memory structure.

To start with, attention should be rivetted to the fact that there exist problems similar to those arising in the CAM structure using the prior art nonvolatile memory cell even when a nonvolatile memory cell is applied to high integration CAM. Referring to a newly considered CAM flash EEPROM structure of FIG. 6 with two bits as one set, new structure as well as ingenious substances pertaining to the present invention will subsequently be clarified.

Figure 6:
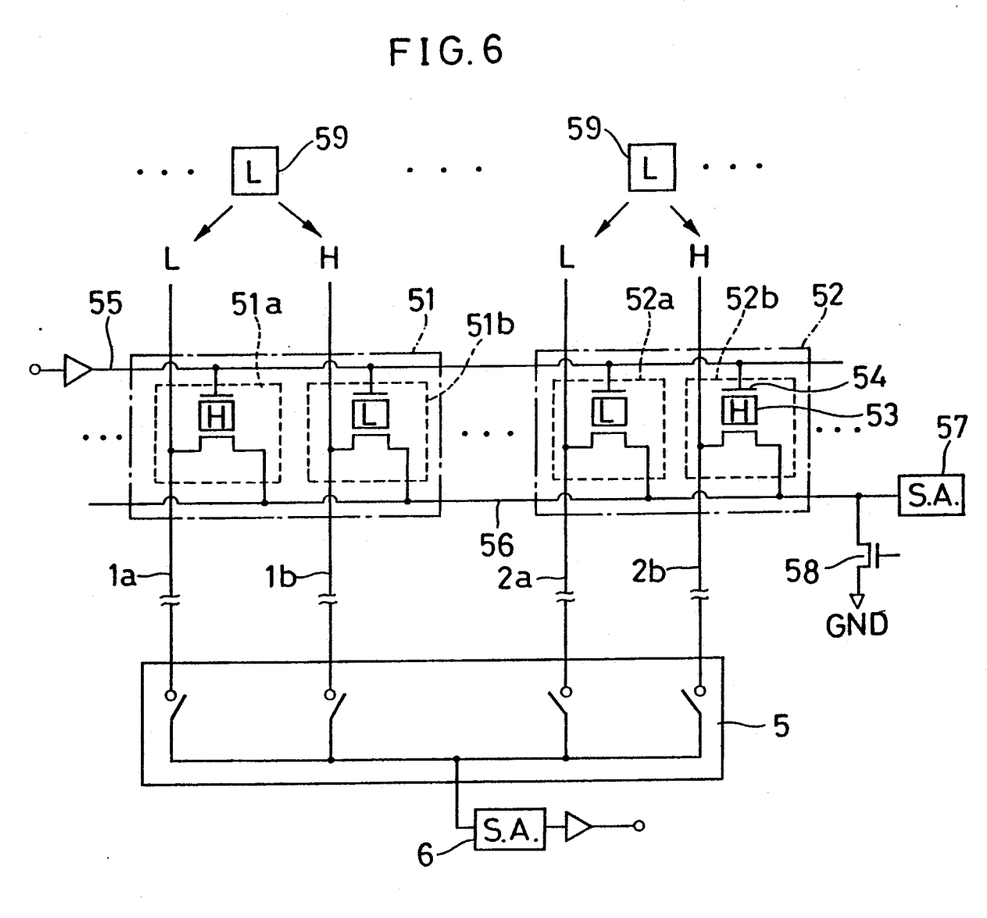
FIG. 6 is a block diagram of a stacked-gate memory illustrating a semiconductor integrated circuit embodying the present invention.

As shown in FIG. 6, a pair of memory cells 51a, 51b constituting a memory 51 and a pair of memory cells 52a, 52b constituting a memory 52 are defined as respective CAM cells.

What is shown in this example is called a stacked-gate structure in which control gates 54 are laid right above respective floating gates 53 for storing electric charge and this structure is considered fit for large-scale integration.

Figure 7:
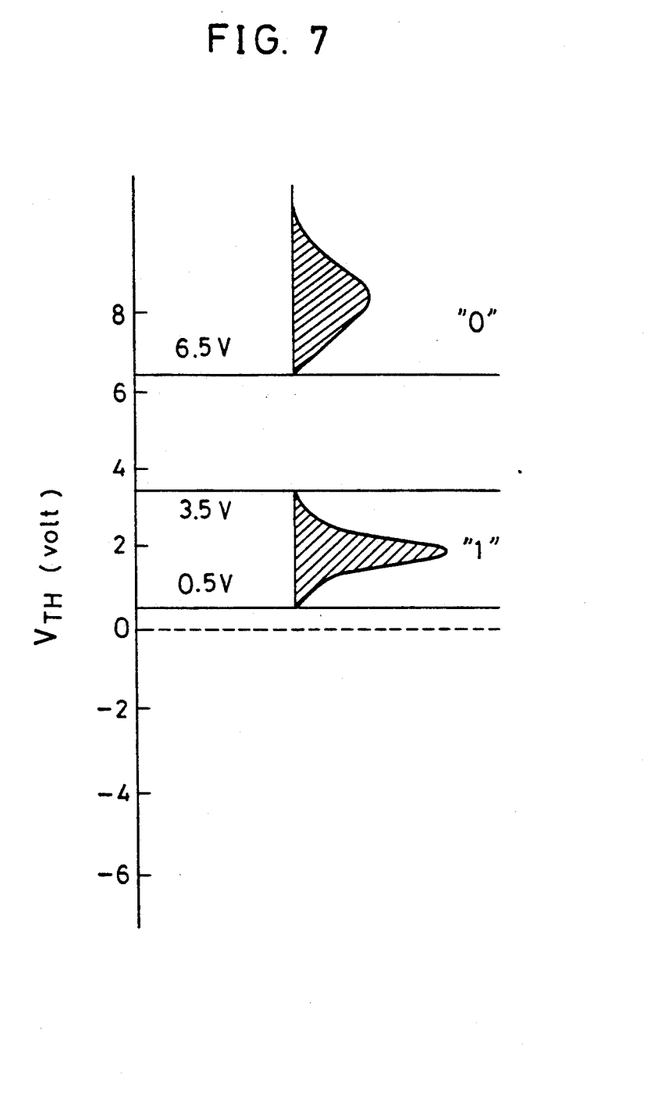
FIG. 7 is a chart showing the distribution of threshold voltages in a stacked-gate memory cell used for the semiconductor integrated circuit of FIG. 6.

FIG. 7 shows the distribution of the threshold voltage Vt varying with the storage of charge in the floating gate 53 in each memory cell.

The low threshold voltage $V_{tL}$ of the memory cell having the stacked-gate structure roughly ranges from 0.5 to 3.5 V and has a variation of about 3 V. It has been considered extremely difficult, in view of structure or the fabrication process, to suppress the variation further. In the case of the CAM structure, this variation becomes ruinous. With this fact as one of the arguing points, a further description will be given as follows.

Electrons are injected into the floating gate 53 of the memory cell 51a, whereby the following is defined: a high threshold voltage $V_{tH}$ (defined as data "0" L (low)); a low threshold voltage $V_{tL}$ (defined as data "1" H (high)) in the case of the memory cell 51b; a low threshold voltage $V_{tL}$ in the case of the memory cell 52a; and a high threshold voltage $V_{tH}$ in the case of the memory cell 52b. In other words, the "0" L (low) data is defined in the CAM cell comprising the memory pair 51, whereas the "1" H (high) is defined in the CAM cell comprising the memory pair 52.

In this state, a consideration is given to a case where data "0" L (low) and "0" L (low) of the reference data 59 are detected in the respective CAM cells.

First, a grounded transistor 58 is turned off and a retrieval sense amplifier 57 is set active. The retrieval sense amplifier 57 is an amplifier of a current driving type and has driving capability itself. Therefore, the potential of a match line 56 is set at roughly 1.5~2.0 V. The set potential should preferably be small enough not to affect the cumulative charge of the floating gate 53 and not greater than 2 V is generally preferred.

The general CAM operation is such that the match line set at predetermined potential is discharged in accordance with the current pulled out by the "0" L (low) of the data line of a mismatch CAM cell and changed to have low potential. The match line thus changed represents mismatch and conversely what maintains predetermined potential without the potential change represents match.

In this example, the data "1" H (high) of the CAM cell of the memory pair 52 differs from the reference data "0" L (low) and the match line 56 is changed to have low potential by making the current flow into a data line 2a ("0" L (low)).

In the specific retrieval operation, the "0" L (low) potential 0 V of the reference data is applied to a data line 1a, whereas the "1" H (high) potential 1.5~2.0 V is conversely applied to a data line 1b. Similarly, the "0" L (low) potential of 0 V the reference data is applied to the data line 2a, whereas the "1" H (high) potential 1.5~2.0 V is conversely applied to a data line 2b. At this time, the high potential is set at as low as roughly 1.5~2.0 V for the reason stated above.

When a selective word line 55 becomes active in that state, the memory cells 51a, 52b whose threshold voltage Vt is $V_{tH}$ (>6.5 V: see FIG. 7) remains in the off state. However, the memory cells 51b, 52a operate differently.

First, the memory cell 52a is specifically considered. In order to cause mismatch to be detected by pulling out the current of the match line 56, the memory cell 52a has to be turned on. Notwithstanding, the threshold voltage Vt takes 0.5~3.5 V in value (see FIG. 7). Moreover, the data line 2a falls on the source electrode side at this time and 0 V is applied thereto. Therefore, the voltage $V_W$ of the selective word line 55 needs to be over 3.5 V and about 4.5 V which is higher by 1 V is normally considered suitable.

In other words, the potential of the match line 56 is lowered by pulling out the current into the 0 V of the data line 2a for the first time when the voltage of the selective word line 55 is set at $V_W \geq 4.5$ V. On the other hand, the retrieval sense amplifier 56 is of the current driving type and has driving capability. For this reason, the potential of the match line 56 finally drops to about 1.0~1.5 V and mismatch is detected because of this voltage drop of about 0.5 V.

Although the voltage drop is used to detect the mismatch, the memory cell 51b of the CAM cell that has stored the match data may malfunction.

The potential of the three electrodes (drain, gate and source) of the memory cell 51b is taken into consideration as follows: over 4.5 V of the selective word line 55 at the gate; 1.0~1.5 V of the potential of the match line 56 at the source; and 1.5~2.0 V of the data line at the drain. That is, the potential difference $V_{GS}$ between the gate and source of this transistor is over 3.0~3.5 V(4.5-(1.0~1.5)).

Incidentally, the threshold voltage Vt of the memory cell 51b is minimum 0.5 V (see FIG. 7).

In other words, $V_{GS}(=3.0~3.5)>V_t(=0.5)$ is established and the transistor in this memory cell 51b is caused to be turned on even though a rise in the threshold voltage of the memory cell 51b due to the substrate bias effect is taken into consideration at this time. Consequently, the through current flows from the high potential of the data line 1b to the low potential of the data line 2a.

In the case of an associate memory, the retrieval operation is generally performed over a plurality of selective word lines. Therefore, the through current in the selective word lines in the whole chip tends to grow large in value, thus posing a serious problem of non-operation.

Moreover, another problem arises that the potential of the data match line rises because of the high potential of the data line 1b, so that the potential difference detection by the retrieval sense amplifier 37 becomes extremely difficult.

Referring to the accompanying drawings, a description will be given of a specific semiconductor integrated circuit based on a study of foregoing problems from a new angle according to the present invention.

Figure 1:
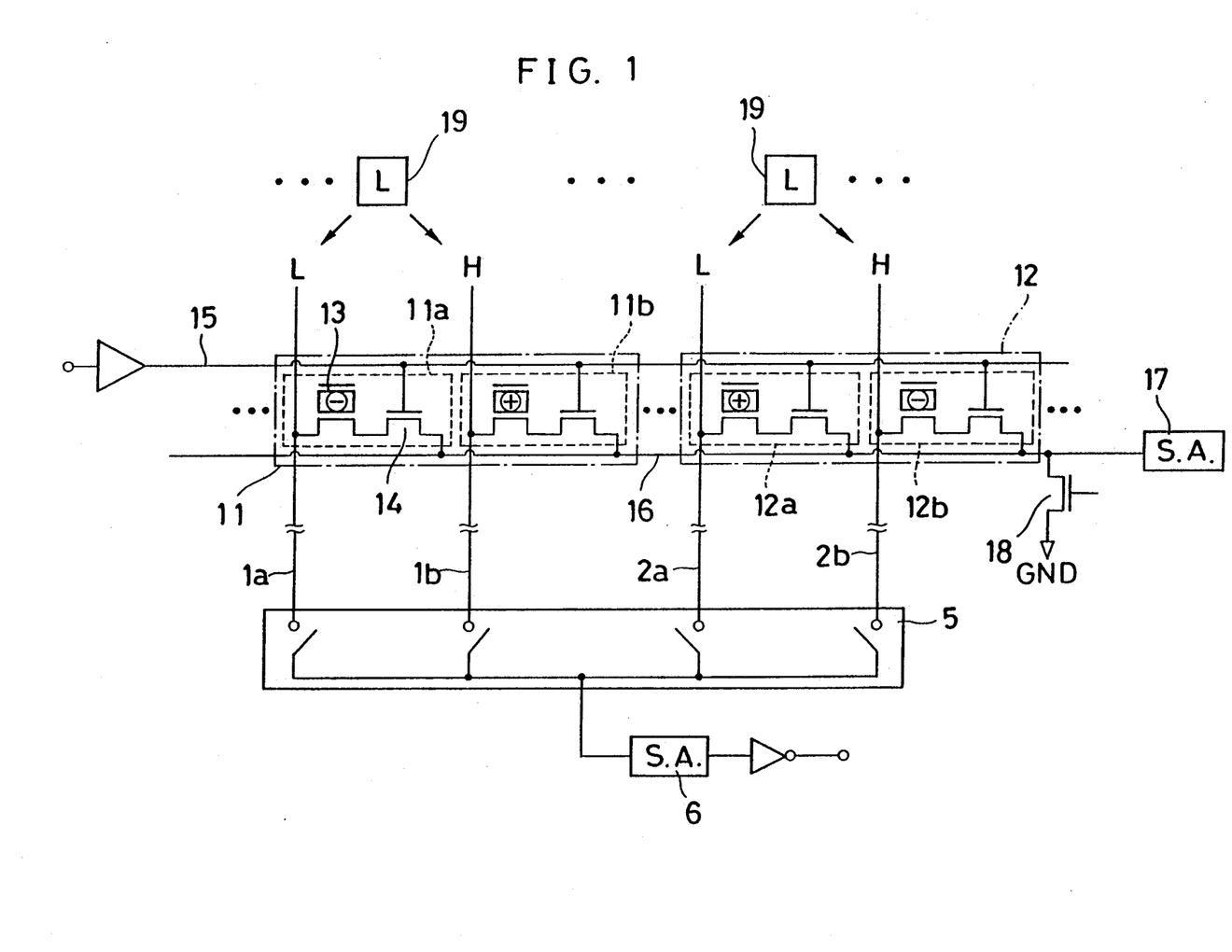
FIG. 1 is a block diagram of a semiconductor integrated circuit embodying the present invention.

FIG. 1 illustrates an embodiment of the first aspect of the present invention. A memory cell of FIG. 1 is called a nonvolatile memory having a MONOS structure and comprises memory transistors 13 for storing data and selective transistors 14. Whether or not electrons are trapped in a nitride film forming the transistor 13 determines that its characteristics are of an enhancement or depression type. On the other hand, the selective transistor 14 connected to the memory transistor 13 in series is of the enhancement type and incorporated into the memory cell in the normal fabrication process.

An object of the present invention is to provide an associative memory structure designed for electrical interference between memory cells to be suppressed at the time of retrieval operation by riveting attention to the fact that the threshold voltage Vt of the aforementioned transistor 14 varies to the least extent.

Negative charge is accumulated in a memory transistor 13 of a memory cell 11a in a "0" L (low) state, for instance, and complimentary data has been stored in a memory cell 11b. Positive charge is accumulated in a memory transistor 13 of a memory cell 12a in a "1" H (high) state and complimentary data has been stored in a memory cell 12b. These memory cells 11a, 11b and 12a, 12b respectively form memory pairs 11, 12 to become a 2-bit CAM cell. The gate electrodes of selective transistors 14 of the respective memory cells 11a, 11b, 12a, 12b are connected to one and the same selective word line 15, whereas the source electrodes thereof are connected to a match line 16. Moreover, a retrieval sense amplifier 17 and a grounded transistor 18 are connected to the match line 16.

A detailed description has been given of the injection (accumulation of negative charge) and the drawing (accumulation of positive charge) electrons into and from the memory gate of the memory transistor 13 of the memory cell in "A 1-Mb EEPROM with MONOS Cell for Semiconductor Disk Application," Takaaki Nozaki et al., IEEE J. Solid-State Circuits, vol 26, no., pp 497-501, April 1991. However, illustration of the control line of the memory transistor 13 will be omitted.

The operation of reading data from the memory cell will briefly be described first. The normal reading operation is performed by a selective circuit 5 and a sense amplifier 6 provided at the leading ends of data lines 1a, 1b, 2a, 2b. The selective circuit 5 connects the sense amplifier 6 to the data line 1b. This amplifier is of a current driving type and the data line 1b is kept at 1.5~2.0 V when no data is read. Subsequently, 5 V is applied to the selective word line 15 and the selective transistor 14 of the memory cell 11b is turned on. On the other hand, positive charge is accumulated in the memory transistor 13, which is of the depression type, and held ON even though the voltage applied to the memory gate is 0 V. Consequently, the memory transistor 13 and the selective transistor 14 connected in series between the data line 1b and the match line 16 are both turned on. Moreover, the match line 16 is fixed by the grounded transistor 18 to the ground potential. Therefore, the potential of the data line 1b drops and varies at about 1.0~1.5 V and the variation is detected and output by the sense amplifier 6.

In this case, the potential of the data line 1b is kept at not higher than 2 V for the reason attributed to preventing the charge accumulated in the memory transistor from being affected at the time of data reading.

The retrieval operation will subsequently be described. First, memory cells 11a, 11b, 12a, 12b with two cells as one set are used to write data. Although these sets are not necessarily adjacent to each other, data contrary to each other are stored in the adjoining cells for convenience of explanation.

The CAM cell 11 formed with the memory pair 11a, 11b is "0" L (low) and the CAM cell 12 formed with the memory pair 12a, 12b is "1" H (high). Reference data 19 is to detect "0" L (low), "0" L (low) with respect to these CAM cells 11, 12. Therefore, the data in the CAM cell 11 accords with reference data and the data in the CAM cell 12 does not.

First, "0" L (low) and "1" H (high) are respectively applied to the data lines 1a, 1b, whereas "0" L (low) and "1" H (high) are respectively applied to the data lines 2a, 2b.

Moreover, the grounded transistor 18 is held OFF and the match line 16 is set in the "1" H (high) state.

When the selective word line 15 becomes "1" H (high) in this state, "1" H (high) voltage is applied to the gates of the selective transistors 14 of the respective memory cells 11a, 11b, 12a, 12b forming the CAM cells 11, 12.

With respect to the memory cells 11a, 12b, these are of the enhancement type as the memory transistor 13 accumulates electrons and like the occasion of data reading, the memory gate is held OFF as 0 V has been applied thereto. Consequently, the match line 16 is not affected by the "0" L (low) state of the data line 1a and the "1" H (high) state of the data line 2b. However, the memory cells 11b, 12a whose memory transistors 13 are of the depression type differ from the above case. The setting of a "0" L (low) or "1" H (high) voltage value is particularly important in this case.

A description will subsequently be given in concrete terms.

In the case of the memory cell 12a, the accumulated data "1" H (high) differs from the reference data "0" L (low). Therefore, the charge in the "1" H (high) state of the match line 16 has to be pulled out, depending on the "0" L (low) state of the data line 2a.

Given the potential of the data line 2a and that of the match line 16 are respectively set at 0 V (L state) and 1.5~2.0 V (H state) and given 5 V (H state) is applied to the selective word line.

Then the potential difference $V_{GS}$ between the source and gate of the selective transistor 14 of the memory cell 12a comes to 5 V.

In other words, $$V_{GS} = (H \text{ voltage of the selective word line } 15) - (L \text{ voltage of the data line } 2a) = 5 - 0 = 5.$$

Moreover, the threshold voltage Vt of the selective transistor 14 is about 0.8 V like the threshold voltage of any peripheral transistor.

Therefore, 5 V > threshold voltage $V_t = 0.8$ V and the selective transistor 14 of the memory cell 12a is turned on with the effect of lowering the potential of the match line 16. Like the sense amplifier 6 at the time of data reading, a retrieval sense amplifier 17 is also of the current driving type and a voltage drop occurs when current is flown into the data line 2a, so that its potential comes at about 1.0~1.5 V.

In the case of the CAM cell 11, on the other hand, the accumulated data "0" L (low) accords with the reference data "0" L (low) and the data line 1b has to be kept in non-contact with the match line 16.

Given 5 V is applied to the selective word line 15 and given the unequal potential of the match line 16 is at 1.0~1.5 V, the potential difference $V_{GS}$ between the source and the gate of the selective transistor 14 of the memory cell 11b is given by $$V_{GS} = 5 - (1.0 \sim 1.5)$$

$= 4.0 \sim 3.5 > 0.8$ (the threshold voltage $V_t$ of the selective transistor 14), the selective transistor 14 of the memory cell 11b is turned on even when a rise in the threshold voltage Vt due to the substrate bias effect is taken into consideration and the data line 1b is connected to the match line 16. In other words, the "1" H (high) potential 1.5~2.0 V of the data line 1b collides with the "0" L (low) potential 0 V of the data line 2a, thus the through current flows between the data line 1b and the data line 2a.

Although what has been described until now is similar to the considerations given previously, the threshold voltage of the selective transistor 14 incorporated during the fabrication process is utilized for controlling purposes. Therefore, the problems in question can readily be solved by controlling the selective work voltage $V_W$ or the threshold voltage $V_t$ of the selective transistor 14. This subject will be described below.

Although the selective word voltage Vw is set at 5 V in the embodiment shown above, it is unnecessary to set the voltage at that high level but only necessary to set it higher than the threshold voltage $V_t$ of the selective transistor 14. Nevertheless, the retrieval speed tends to become slow if the voltage is set too low. Moreover, the word voltage Vw may be raised up to the voltage as an upper limit at which the selective transistor 14 of the memory cell 11b is not turned on, the selective transistor 14 having the potential (1.0~1.5 V) of the match line 16 to be pulled out by the selective transistor 14 of the memory cell 12a as the source electrode, and the word voltage Vw of the selective word line 15 as the gate potential.

This process is expressed by the following equation:

$$V_w > V_t (0.8 \text{ V})$$

$$V_w - (1.0 \sim 1.5) < V_{t'}$$

where $V_{t'} = V_t + \Delta V$ (about 1 V equivalent to the substrate bias effect), that is, $$V_t < V_w < (\text{potential at the time of mismatch of the match line}) + V_{t'} \quad \text{Eq. (1)}$$

More specifically, given the word voltage of the selective word line 15 at the time of retrieval operation is selected as, for instance, 3 V or more, only the selective transistor 14 of the memory cell 12a can be turned on and the selective transistor 14 of the memory cell 11b can be turned off. As a result, while the through current from the "1" H (high) potential 1.5~2.0 V of the data line 1b to the "0" L (low) potential 0 V of the data line 2a is suppressed, the decrease in the retrieval speed may be practically no problem.

The conventional associative memory of a nonvolatile type is unable to solve this problem, which may be solved by arranging a means of controlling a selective transistor having the threshold voltage incorporated during the fabrication process and properly selecting the word voltage of the selective word line when the retrieval operation is performed.

As is obvious from Eq. (1), moreover, the threshold voltage Vt of the selective transistor is set at about 3.0 V, whereby $$3.0 < Vw < (1.0 \sim 1.5) + (3.0 + 1) \text{ from Eq.} \quad (1)$$

and the word voltage Vw may be set as high as what is used at the time of data reading by setting it at 5 V or thereabout. Thus, the voltage of the selective word line is simply controllable.

Figure 2:
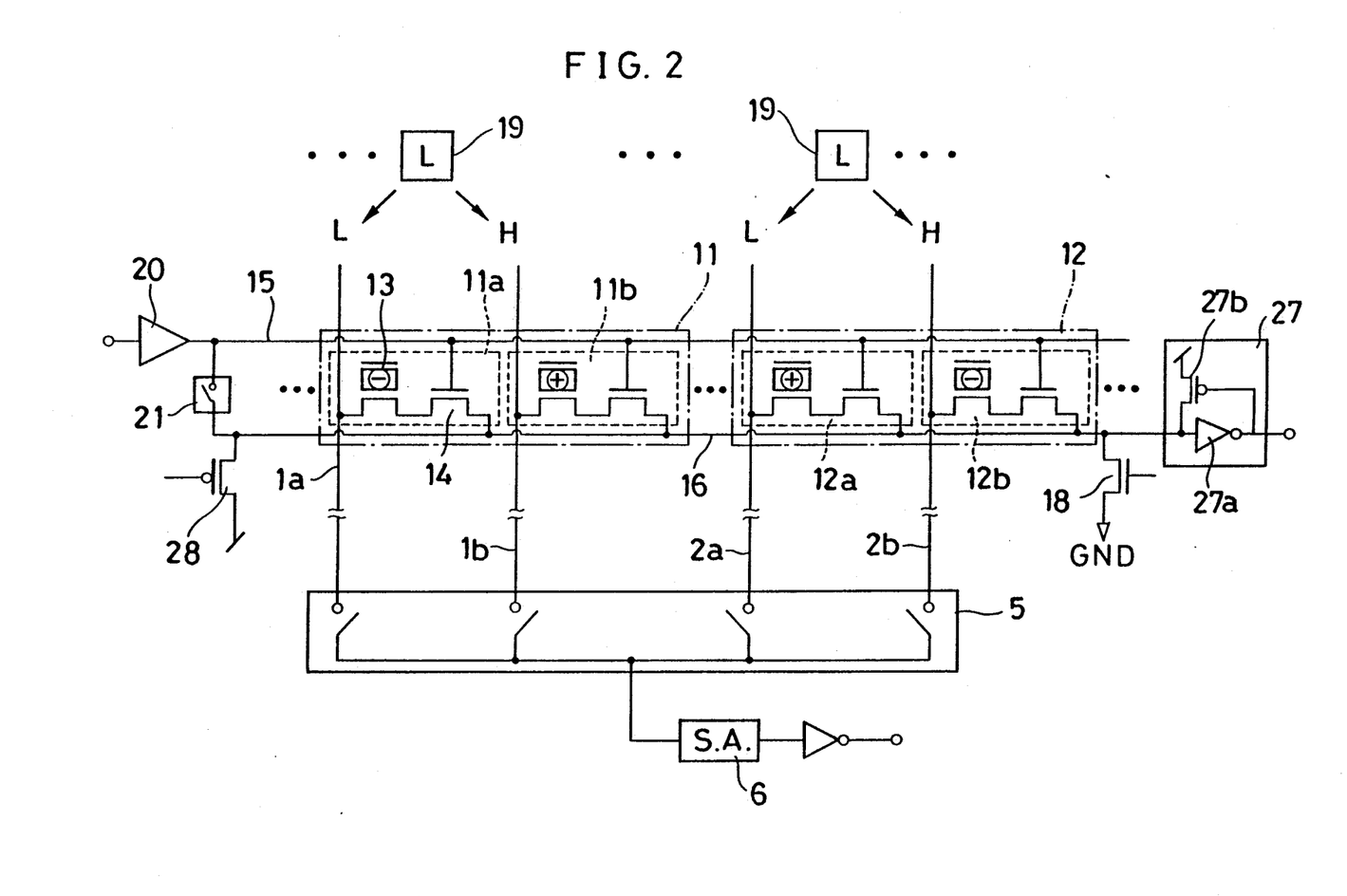
FIG. 2 is a block diagram of another semiconductor integrated circuit embodying the present invention.

Subsequently, a (second) embodiment of the second aspect of the present invention is shown in FIG. 2. This is also an associative memory so arranged as to control the selective transistor 14 having the threshold voltage Vt incorporated during the fablication process.

What makes this embodiment different from the first embodiment is that there is provided a tristate buffer 20 for making the selective word line 15 afloat, and a connection means 21 for connecting the selective word line 15 to the match line 16 at the time of data retrieval. The storage condition of the memory cells 11a, 11b, 12a, 12b is the same as that in the first embodiment.

An retrieval sense amplifier 27 is used to detect a reduction in potential resulting from pulling out the precharged charge of the match line 16 by the "0" L (low) potential 0 V of the data line 2a connected to the memory cell 12a and unlike the current driving type in the first embodiment, no steady retrieval current exists. Therefore, it is a sense amplifier of a low power consumption type and superior as a sense system for an associative memory with the simultaneous multiple retrieval operation as a basis. Needless to say, the current driving type amplifier as same as that of the first embodiment may use as the retrieval sense amplifier.

The basic idea is that the connection means 21 is used to lower also the potential of the selective word line 15 when the potential of the match line 16 is lowering as mismatch is detected at the time of retrieval operation. The selective transistor 14 is kept in the OFF state or what is close thereto by reducing the voltage difference between the source electrode (match line 16) and gate electrode (selective word line 15) of the selective transistor 14 to almost nearly 0.

Since the potential in the "1" H (high) state of the data line 1b at this time is 1.5~2.0 V, the word voltage Vw of the selective word line 15 also needs to satisfy the following equation (2) similar to the equation (1) at the time of retrieval operation as in the case of the first embodiment.

$$V_t < V_w < (\text{data line voltage of } 1'' \text{ (H)}) + V_f \quad \text{Eq. (2)}$$

where $V_f = V_t + \Delta V$ (about 1 V equivalent to the substrate bias effect).

In this case, the maximum value of Vw may be increased by about 0.5 V in comparison with Eq. (1). Unlike the first embodiment, the voltage difference between the source electrode (match line 16) and gate electrode (selective word line 15) of the selective transistor 14 is set close to 0 V, and only a path with the data line 1b as the source electrode side may be used as a steady current path. Consequently, the retrieval speed is slightly improved.

A specific driving method will be described by way of example.

First, the grounded transistor 18 is turned off. Subsequently, the connection means 21 is used to connect the selective word line 15 to the match line 16 and the tristate buffer 20 makes the selective word line 15 afloat. Moreover, the match line 16 is precharged by a precharge transistor 28 up to the maximum allowable value $\{(1.5 \sim 2.0) + V_f\}$ of the word voltage $V_w$. At this time, potential 1.5~2.0 V in the "1" H (high) state has been applied to each of the data lines 1a, 1b, 2a, 2b.

When the precharging of the match line 16 and the selective word line 15 is completed, potential corresponding to the reference data 19 is subsequently given to each of the data lines 1a, 1b, 2a, 2b. In other words, "0" L (low) potential 0 V and "1" H (high) potential 1.5~2.0 V are applied to the data lines 1a, 2a and the data lines 1b, 2b, respectively (this state is hereinafter called "retrieval start state").

As in the first embodiment, the memory transistors 13 of the memory cells 11a, 12b are of the enhancement type with the gate voltage at 0 V and remain in the OFF state. However, the memory transistors 13 of the memory cells 11b, 12a are of the depression type and remain in the ON state.

The source electrode of the selective transistor 14 of the memory cell 12a is connected to the data line 2a and the gate electrode thereof to the selective word line 15. Therefore, the potential difference $V_{GS}$ between the gate and source of the selective transistor 14 is at 1.5~2.0 V in the retrieval start state.

Moreover, the selective word line 15 is connected by the connection means 21 to the match line 16. Consequently, the potential difference between the drain electrode (connected to the match line 16) and the gate electrode (connected to the selective word line 15) of the selective transistor 14 of the memory cell 12a steadily comes to 0 V. Therefore, the charge of the match line 16 is pulled out by the data line 2a.

Any difference from the first embodiment in this state is that the retrieval sense amplifier 27 has no steady current driving capability. A pchMOS 27b to which the output of the identity retrieval sense amplifier 27 has been fed back is of very low driving capability for reducing the effect of noise and the like.

Consequently, the match line 16 has not steady driving current though consumes less power.

When the charged-up charge is pulled out, the potential lowers and when it becomes lower than the threshold voltage of the inverter 27a of the retrieval sense amplifier 27, the output conforming to "1" H (high) is detected. In other words, the potential of the match line is basically caused to drop up to 0 V of the "0" L (low) potential to be pulled out.

With this point in mind, considerations are given to the selective transistor 14 of the memory cell 11b while the potential is lowering as the charge of the match line 16 is pulled out.

In an initial retrieval state, all of the source, gate and drain electrodes of the selective transistor 14 of the memory cell 11b have been set at the "1" H (high) state and also set in the OFF state.

However, the charge of the match line 16 is induced to low potential because of the "0" L (low) state of the data line 2a. Given the potential of the match line 16 at this time is Vs, $$V_S + \Delta v = V_W \text{ (potential of the selective word line 15)} < \text{potential of the data line } 1b \ (\Delta v << 1) \quad \text{Eq. (3)}$$

Therefore, there exists no current path which makes the data line 1b a source electrode side as the gate voltage of the selective transistor 14 rises from the data line 1b.

The path that can be considered is what makes the match line 16 a source electrode side. The potential difference $V_{GS}$ between the gate and source at this time is obtained from Eq. (3)

$$V_{GS} = V_W - V_S = \Delta v$$

In this case, the problem is where the value of $\Delta v$ is in comparison with the then threshold voltage $V_f$ of the selective transistor 14. However, the $\Delta v$ is a transient micro voltage difference and steadily comes to 0 V and besides no problem ultimately arises.

The reason for the presence of the micro voltage difference is attributed to the occurrence of the potential fluctuation time difference between each point of the selective word line 15 and that of match line 16 resulting from resistance, junction capacitance or parasitic capacitance due to the formation of the match line 16 or the connection means 21 on the semiconductor substrate. As the time difference is still very small, the quantity of current allowed to flow temporarily is also insignificant.

There are various methods of suppressing the micro voltage difference, including reducing the resistance of wiring material, providing a plurality of connection means 21, and slowing the pulling out of the low potential originating from the "0" L (low) state of the data lines 1a, 2a to the extent that the time difference is ignorable.

With the aforementioned structure, the potential difference VGS between the gate and source of the selective transistor 14 will never steadily become greater than the threshold voltage $V_t$ even though the source electrode is placed on any one of sides of the data line 1b and the match line 16. Anyway, the selective transistor 14 of the memory cell 11b remains in the OFF state.

Therefore, the charge of the match line 16 is pulled out by the data line 2a without causing the through current to steadily flow from the data line 1b to the data line 2a and decreases up to the ultimate threshold voltage Vt (about 0.8 V) of the selective transistor 14. The potential reduction is detected by the inverter of the retrieval sense amplifier 27 and the "1" H (high) state is output.

Data is normally read from the memory through the steps of cutting off the connection means 21, turning off the precharge transistor 28 and turning on the grounded transistor 18. Further, any one of the data lines 1a, 1b, 2a, 2b of the memory cells 11a, 11b, 12a, 12b is connected via a selection circuit to the sense amplifier 6 of the current driving type having the current driving capability and the selective word line 15 is placed in the "1" H (high) state to activate the selective transistor 14. Data is read in this way.

In this case, it is unnecessary to lower the drive voltage of the selective word line 15 as in the case of retrieval operation and 5 V (power supply voltage) is usually selected. With respect to the data line connected to the sense amplifier 6 of the current detection type, however, potential as low as 1.5~2.0 V is set so as to hold the charge of the memory transistor 13. The potential of the data line is set in such a way as to make the variation-free memory transistor 13 of the enhancement type (negative charge being accumulated) keep 1.5~2.0 V and to make the depression type (positive charge being accumulated) cause a potential drop to 1.0~1.5 V. The potential difference originating from this data is detected and output.

When the threshold voltage $V_t$ of the selective transistor 14 is set at about 2.5 V but not at about 0.8 V like the normal peripheral transistor as in the case of the first embodiment, $2.5 < V_W < (1.5 \sim 2.0) + (2.5 + 1.0) = 5.0 \sim 5.5$ is obtained from Eq. (2) and $V_W$ may be set at 5 V as in the case of normal data reading. Therefore, power to be supplied to the tristate buffer 20 for driving the selective word line 15 is readily controllable.

The aforementioned arrangement or the control operation is possible only when the selective transistor 14 having the threshold voltage Vt which is incorporated during the fabrication process and offers excellent controllability is utilized and impossible when use is made of the conventional memory whose threshold voltage drastically varies (0.5~3.5 V) on the ON side.

Although a description has mainly been given of the nonvolatile memory having the MONOS structure in the embodiments shown, the present invention is needless to say applicable to EEPROM or ROM having the gate incorporated under an ordinary process as a selective gate.

Figure 3:
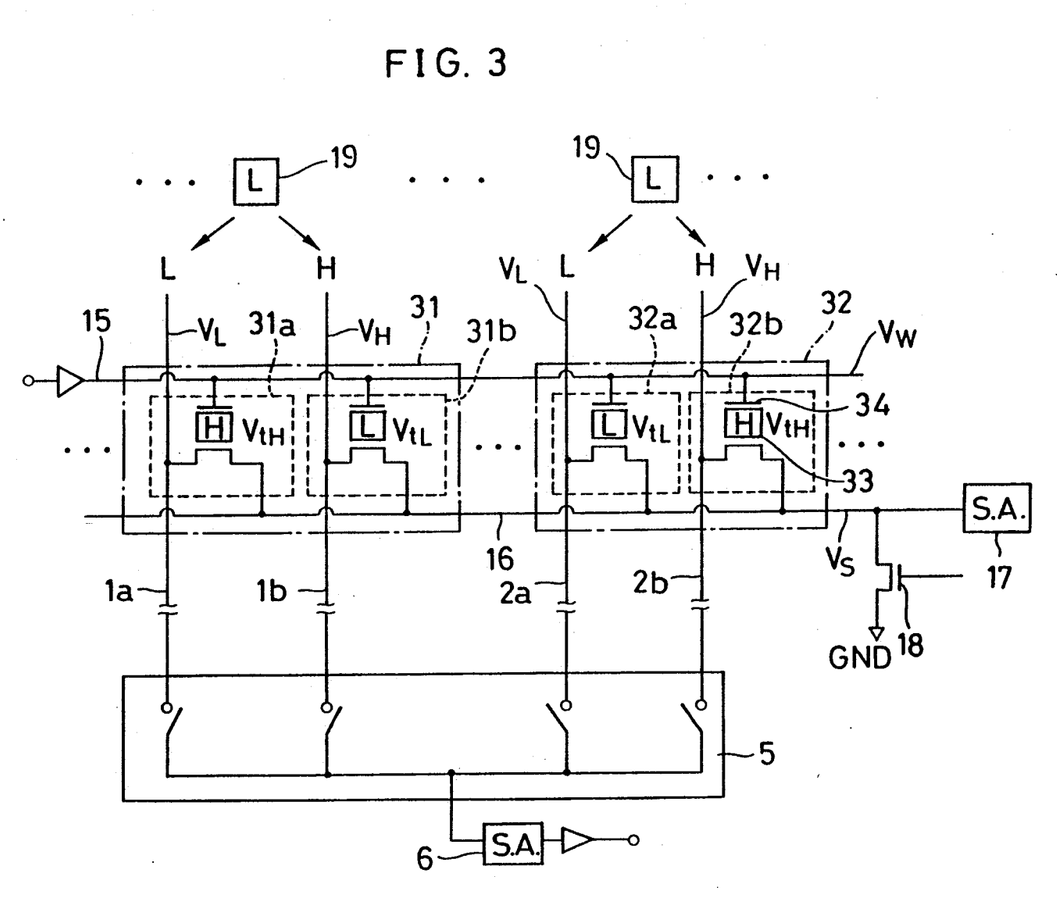
FIG. 3 is a block diagram of still another semiconductor integrated circuit embodying the present invention.

FIG. 3 shows an embodiment of a semiconductor integrated circuit having an associative memory structure in a third aspect of the present invention.

Like what is shown in FIG. 6, a CAM memory of FIG. 3 is constructed of EEPROM memory cells with two bits as one set forming a CAM structure unit. A CAM memory 31 comprises, for instance, stack type flash EEPROM cells 31a, 31b and data are written to the EEPROM cells 31a, 31b in such a way that storage states are contrary to each other. In this case, data "0" L (low) is written to the EEPROM cell 31a, data "1" H (high) to the EEPROM cell 31b, data "1" H (high) to the EEPROM cell 32a and data "0" L (low) to the EEPROM cell 32b. These EEPROM memory cells 31a, 31b and the memory cells 32a, 32b respectively form memory pairs and become 2-bit CAM memory cells 31, 32.

Figure 4:
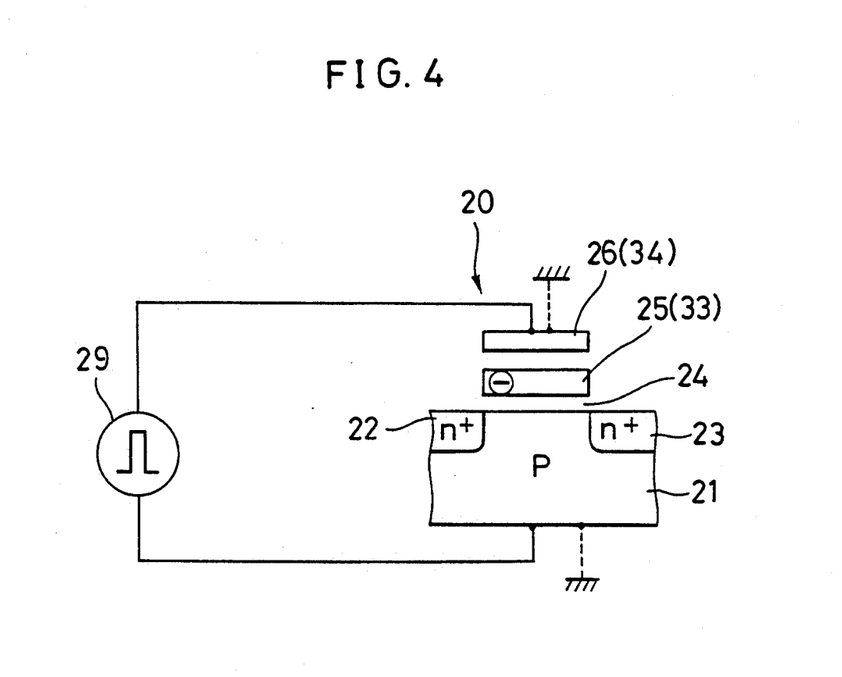
FIG. 4 is a block diagram of an EEPROM cell used for a semiconductor integrated circuit embodying the present invention.

The EEPROM memory cells 31a, 31b, 32a, 32b comprise, for instance, an EEPROM memory cell 20 having a specific structure shown in FIG. 4. The EEPROM memory cell 20 further comprises a source 22 and a drain 23 of an n type formed in a P substrate 21, a tunnel oxide film 24 therebetween on the P substrate 21, a floating gate 25 thereon, and a control gate 26 thereon. A "0" L (low) data state is defined through the steps of injecting hot electrons into the floating gate 25 for writing operation by applying write high-voltage pulse 29 to the control gate and raising the threshold voltage Vt to a predetermined voltage higher than Vw. Moreover, "1" H (high) data is written by pulling electrons out of the floating gate toward the source 22 or the drain 23. According to the present invention, the threshold voltage of the EEPROM memory cell to which the data "0" L (low) has been written takes the high threshold voltage $V_{tH}$, whereas the threshold voltage of the EEPROM memory cell to which the data "1" H (high) has been written takes the low threshold voltage $V_{tL}$.

Therefore, a symbol "H" written to the floating gates 33 of the EEPROM memory cells 31a, 32b of FIG. 3 represents a state in which electrons have been injected and the transistors of these cells have the high threshold voltage $V_{tH}$, thus indicating that the data "0" L (low) has been stored. On the other hand, a symbol "L" written to the floating gates 33 of the EEPROM memory cells 31b, 32a represents a state in which electrons have been pulled out and the transistors of these cells have the low threshold voltage $V_{tL}$, thus indicating that the data "1" H (high) has been stored.

In the CAM memory cell 31, the drain of the EEPROM memory cell 31a is connected to a data line (bit line) 1a, that of the EEPROM memory cell 31b to a data line (bit bar line) 1b, the control gates of both memory cells 31a, 31b to the same selective word line 15, and the sources of both memory cells 31a, 31b to the match line 16. The CAM memory cell 32 is arranged similarly excluding the contents of data in the EEPROM memory cells 32a, 32b as components and the connection of the drains of both memory cells 32a, 32b to the respective data lines 2a, 2b. Further, the match line 16 is provided with a retrieval sense amplifier 17 and the grounded transistor 18.

A plurality of CAM memory cells are arranged with the match line 16 and selective word line 15 for common use.

The operation of reading data from the CAM memory cell will briefly be described. The selection circuit 5 and sense amplifier 6 provided at the leading ends of the data lines 1a, 1b, 2a, 2b are used in the normal operation of reading data. The selection circuit 5 connects the sense amplifier 6 to the data line 1b. This amplifier is of the current driving type and the data line 1b is kept at, for instance, 1.5~2.0 V when no data is read. When Vw, 5 V for instance, is applied to the selective word line 15, the memory cell 31b between the data line 1b and the match line 16 is turned on since $V_w > V_{tL}$. On the other hand, the match line 16 is fixed by the grounded transistor 18 to the ground potential at this time and consequently the potential of the data line 1b is lowered and changed to about 1.0~1.5 V. The sense amplifier 6 detects this change and outputs the result.

On the other hand, the selection circuit 5 connects the sense amplifier 6 to the data line 1a and the data line is also kept at 1.5~2.0 V. Subsequently, $V_W$ (5 V) is applied to the word line 15 likewise. However, the EEPROM memory cell 31a between the data line 1a and the match line 16 is not turned on since it has the high threshold voltage $V_{tH}$ and $V_W < V_{tH}$. Therefore, the potential of the data line 1a does not vary. The sense amplifier 6 detects this state and outputs the result. In this way, the data stored in each memory cell is read.

The potential of the data lines 1a, 1b are set at not higher than 2 V in this case and the reason for this is to prevent the charge accumulated in the memory cell from being affected at the time of data reading.

A description will subsequently be given below of the fact that retrieval operation of input data is possible in the CAM memory thus structured without causing any inconvenience such as potential interference between the memory cells.

In the present invention, it has been arranged that the relations among the voltage $V_W$ applied to the selective word line at the time of retrieval operation, the voltage $V_L$ applied to the data line supplied with data "0" L (low), the voltage $V_H$ applied to the data line supplied with data "1" H (high), the voltage Vs applied to the match line, and the low threshold voltage $V_{tL}$ of the EEPROM memory cell storing data "1" in the CAM memory with two bits as one set satisfy the following equations:

$$V_W - V_H < V_{tL} < V_W - V_L \qquad \text{Eq. (4)}$$

$$V_W - V_S < V_{tL} \qquad \text{Eq. (5)}$$

Needless to say, the EEPROM memory cell storing data "0" in the CAM memory with two bits as one set has the high threshold voltage $V_{tH}$ as usual and is not turned on even when the voltage Vw to be applied to the selective word line is applied (high state). In other words, $$V_{tH} > V_W - V_L > V_W - V_H \text{ and } V_{tH} > V_w - V_S \qquad \text{Eq. (6)}$$

is set likewise in this case.

From Eqs. (4), (5) and (6), the voltage of each signal line and the threshold voltage of the nonvolatile memory cell are so arranged as to satisfy Eqs. (I) and (II) simultaneously in the third aspect of the present invention.

$$V_W - V_H < V_{tL} < V_W - V_L < V_{tH} \qquad \text{(I)}$$

$$V_W - V_S < V_{tL} \qquad \text{(II)}$$

A description will subsequently be given of the retrieval operation. First, data is written to the memory cells 31a, 31b, 32a, 32b as memory pairs with two cells as one set. Although this memory pair is not necessarily formed with memory cells adjacent to each other, data contrary to each other are written to the adjoining cells for convenience of explanation.

The CAM cell 31 comprising the memory pairs is "0" L (low), whereas the CAM cell 32 as the memory pair is "1" H (high). The reference data 19 consisting of "0" L (low), "0" L (low) are to be detected with regard to these CAM memory cells 31, 32, respectively. Therefore, the data in CAM cell as the memory pair 31 conforms to reference data 19 and the data in the CAM cell as the memory pair 32 does not conform thereto.

First, "0" L (low) voltage $V_L$ (normally 0V) is applied to the data line 1a, "1" H (high) voltage $V_H$ to the data line 1b, "0" L (low) voltage $V_L$ to the data line 2a, and "1" H (high) voltage $V_H$ to the data line 2b.

Moreover, the grounded transistor 18 is turned off and the match line 16 is set in the "1" H (high) state. In this case, Vs represents the voltage of the match line 16.

When the selective word line 15 becomes "1" H (high) in this state, the voltage Vw is applied and the "1" H (high) voltage is applied to the control gates 34 of the memory cells 31a, 31b, 32a, 32b forming the respective memory pairs 31, 32.

The memory cells 31a, 31b with the floating gates 33 into which electrons are injected have the high threshold voltage $V_{tH}$ and are not turned on at the H (high) voltage Vw of the selective word line as shown by Eq. (6) and keep the OFF state as in the case of the aforementioned data reading (this is also applied to a case where the EEPROM memory cell at $V_{tH} > 6.5$ V is used to set $V_W = 5$ V, $V_H = 1.5 \sim 2.0$ V, $V_L = 0$ V, $V_S = 1.5 \sim 2.0$ V as shown in FIG. 7). Consequently, the "0" L (low) state of the data line 1a and the "1" H (high) state of the data line 2b will never affect the match line 16. However, the memory cells 31b, 32a having the low threshold voltage $V_{tL}$ are different. Importance is attached to see what relation between the low threshold voltage $V_{tL}$ and the voltages $V_W$, $V_H$, $V_L$, $V_S$ of the respective signal lines satisfies Eqs. (I) and (II) above.

A detailed description will be given further.

In the case of the memory cell 32a, the accumulated data "1" H (high) differs from the reference data "0" L (low). The "0" L (low) state of the data line 2a may necessitate it to pull out the charge in the "1" H (high) state of the match line 16.

Given the voltage of the data line is set at $V_L$ (L state) and the voltage of the match line 16 at $V_S$ (H state) and given $V_W$ (H state) is applied to the selective word line.

Then the potential difference $V_{GS}$ between the gate and source of the memory cell 32a comes to $V_W - V_L$. That is, $V_{GS}$ = (H voltage of the selective word line 15)-(L voltage of the data line 2a).

On the other hand, the threshold voltage Vt of the EEPROM memory cell 32a is the low threshold voltage VtL.

According to the present invention, $V_W - V_L >$ low threshold voltage $V_{tL}$ as it has been arranged that Eq. (I) is satisfied and the memory cell 32a is turned on with the effect of lowering th potential of the match line 16. The retrieval sense amplifier 17 detects the voltage drop and outputs a mismatch signal.

On the other hand, the accumulated data "0" L (low) conforms to the reference data "0" L (low) in the case of the memory pair 31. In order to prevent potential interference between the memory cells of the memory pair connected to the same selective word line, the memory cell 31b has to remain in the OFF state and the data line 1b and the match line 16 also has to keep the noncontact state.

In this case, the potential difference $V_{GD}$ between the gate and drain of the memory cell 31b comes to $V_W - V_H$ and the potential difference $V_{GS}$ between the gate and source comes to $V_W - V_S$.

More specifically, $V_{GD}$=(H voltage of the selective word line 15)−(H voltage of the data line 1b)=$V_W - V_H$ $V_{GS}$=(H voltage of the selective word line 15)−(voltage of the match line)=$V_W - V_S$ On the other hand, the threshold voltage $V_t$ of the EEPROM memory cell 31b is the low threshold voltage VtL. According to the present invention, $V_{GD}=V_W-V_H<V_{tL}$ and $V_{GS}=V_W-V_S<V_{tL}$ as it has been arranged that Eqs. (I) and (II) are satisfied and the EEPROM memory cell 31b is not turned on. Therefore, the data line 1b and the match line 16 keep the noncontact state.

In other words, since the relation between the voltages $V_W$, $V_H$, $V_L$, $V_S$ of the respective signal lines (the word line 15, the data lines 1a, 1b, 2a, 2b and the match line 16) and the threshold voltages of the EEPROM memory cells 31a, 31b, 32a, 32b, particularly the low threshold voltage $V_{tL}$ of the cells 31b, 32a is regulated when the retrieval operation is performed, only the memory cell 31b is turned on and the memory cell 31b is turned off. As a result, the through current can be controlled and prevented from flowing from the "1" H (high) potential $V_H$ of the data line 1b to the "0" L (low) potential of the data line 2a.

Therefore, both EEPROM memory cells as match cells are not turned on and only one of the EEPROM memory cells as a mismatch cell is turned on even though the mixture of mismatch and match cells in reference to reference data and storage data exists in a number of CAM cells 31, 32 . . . controlled by the same selective word line 15 to ensure that the potential of the match line 16 is caused to drop without potential interference. Mismatch can thus be detected by detecting that voltage by means of the retrieval sense amplifier 17.

When the reference data accords with the storage data in all the CAM cells controlled by the same selective word line 15, all the EEPROM memory cells in these CAM cells are not turned on and besides the data line and match line 16 will never be connected electrically. Consequently, the potential of the match line 16 will not change from the voltage predetermined Vs. Match can thus be detected by detecting that voltage by means of the retrieval sense amplifier 27.

The conventional nonvolatile type associative memory in which the threshold voltage and the voltage of each signal line have not been regulated is not capable of performing the retrieval operation for certain without the potential interference between the memory cells at all times. The threshold voltage of such a nonvolatile memory and the voltage of each signal line are regulated as follows: (1) As illustrated in the third embodiment of FIG. 3, the low threshold voltage of EEPROM is regulated or set so that Eqs. (I) and (II) above are satisfied or (2) the voltage of each signal line, particularly the voltages of the selective word line, the first and second data lines and the match line are regulated or set so that the Eqs. (I) and (II) above are satisfied as illustrated in the fourth embodiment of FIG. 5 when the threshold voltage of a nonvolatile memory for use, particularly the low threshold voltage has been determined.

When the low threshold voltage $V_{tL}$ of EEPROM of (1) is regulated or set, the means 29 for applying a high-voltage pulse shown in FIG. 4 may be used. Given the voltage $V_W$=5 V of the control word line, the voltage $V_L$ of the input data line of the data "0", the voltage $V_H$ of the input data line of the data "1" and the voltage $V_S$=1.5∼2.0 V of the match line as before, for instance, the high threshold voltage of EEPROM should be set at $V_{tH}>5$ V and the low threshold voltage at $3.0 V<V_{tL}<5$ V. When the threshold voltage Vt is regulated or set, the quantity of hot electrons to be injected into the floating gate 33 should be regulated or set by varying the intensity of the high-voltage pulse applied to the control gate 34 and the number of voltage applications using the means 29 for applying a high-voltage pulse or by pulling electrons out of the floating gates 33 and further by regulating or setting the quantity of electrons to be pulled out.

Figure 5:
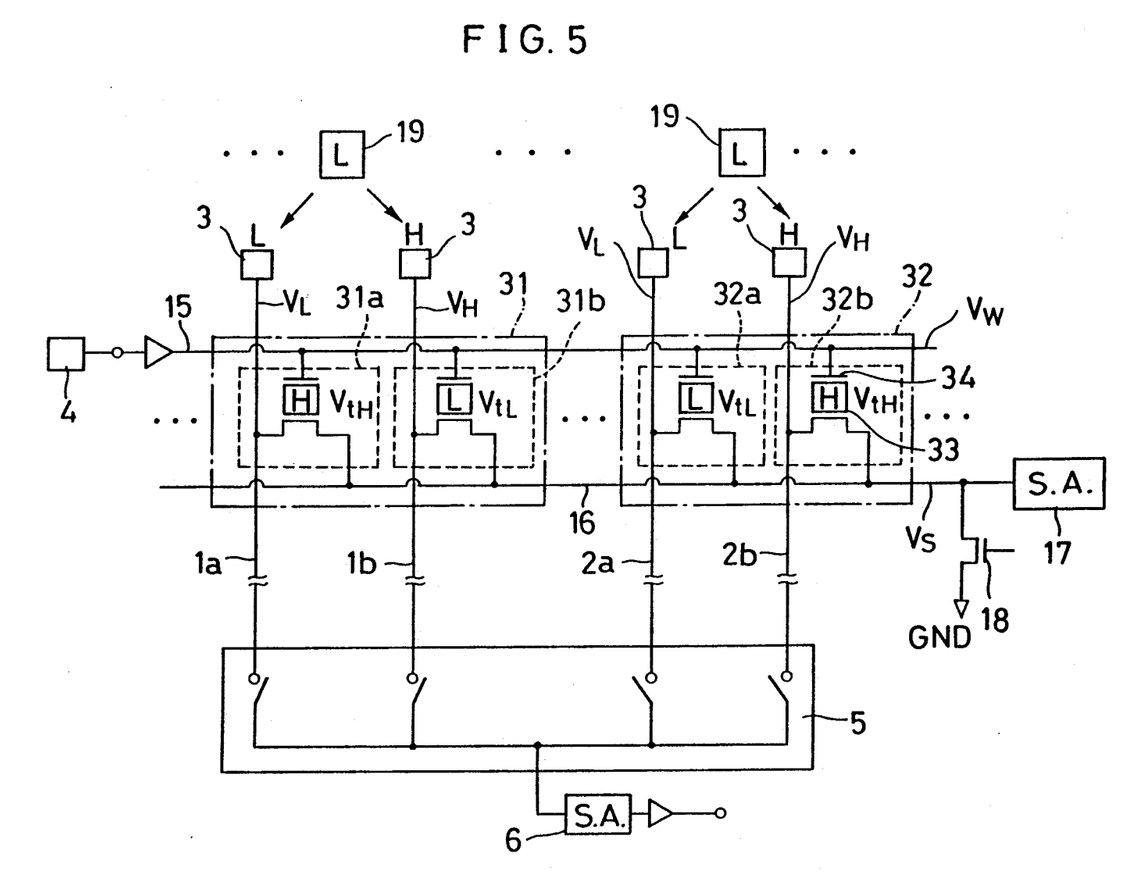
FIG. 5 is a block diagram of still another semiconductor integrated circuit embodying the present invention.

When the voltage of each signal line of (2) is regulated or set as shown in FIG. 5, the voltage $V_H$ of the data "1" and the voltage $V_L$ of the data "0" of first and second data lines should be easily regulated or set by respective voltage selective means 3, the drive voltage $V_W$ of the control word line 15 by voltage control means 4, the voltage of the match line 16 by the retrieval sense amplifier 17 of the current driving type or by changing the percharge voltage of the precharge transistor 28 of the retrieval sense amplifier 27 of a dynamic type as shown in FIG. 2. In this case, the voltage control means are not particularly restricted and any one of those heretofore known may be employed.

Although a description has been given of the EEPROM memory cell formed with the CAM cell with two bits as one set as a representative example, the present invention is not limited to this CAM cell and needless to say applicable to ordinary nonvolatile memory cells (mask ROM, EPROM and the like)

Moreover, the associative memory unit according to the present invention may be adapted for use in what incorporates match line, a sense amplifier (S. A.), a first data line (bit line), and a second data line (bit bar line) for common use in order to increase integration (see U.S. patent application Ser. No. 07/883,595).

Although a description has been given of NOR type memory cells on the whole, the present invention is applicable to NAND type CAM cells (regarding the NAND type structure, see U.S. patent application Ser. No. 07/883,595).

In the first and second embodiments of the present invention, the through current can be suppressed effectively for the first time when CAM is structured on the basis of the nonvolatile memory having the selective gate. In addition, the retrieval operation is made possible only by making a memory layout quite effective in integration without rearranging the ordinary nonvolatile memory and by treating such a memory as a memory pair with two bits as one set.

Therefore, it is possible to utilize CAM locally or as an ordinary nonvolatile memory with ease, whereby CAM capable of large scale integration as well as freedom in designing.

In the third embodiment of the present invention, the through current is controlled or prevented from flowing at the time of retrieval operation in the nonvolatile memory having the CAM structure with two bits as one set so that retrieval operation in a number of memory cells can be carried out at high speed without mutual interference. Moreover, the electrical collision between CAM cells can be obviated at the time of retrieval operation by setting the low threshold voltage of the memory cell to a desired value even when the voltage of each signal line is unchangeable to a degree and by regulating the voltage of each signal line when the threshold voltage of the memory cell forming each CAM cell greatly varies as in the case of the conventional memory cell. The freedom of memory cell selection can thus be increased to a greater extent.

When this CAM in each embodiment is used as a data base memory on which importance has recently set, a large capacity data base system having an extremely high speed, optional key word retrieval function may be attainable. The present invention is of very wide application for the systems including the aforementioned IC cards, electronic dictionaries, telephone directories, character and audio recognition, and translation among various languages.

What is claimed is:

1. A semiconductor integrated circuit comprising:
   a first memory cell for providing one of an electrical connection and an electrical nonconnection between a first data line and a match line;
   a second memory cell for defining one of an electrical nonconnection and an electrical connection between a second data line and said match line, wherein the first and second memory cells electrically connect the match line to at least one of the first and second data lines;
   selective transistors for making and breaking the electrical connection/nonconnection between each of said first and said second data lines and said match line in accordance with the definition of the electrical connections of said first and second memory cells; and
   a current driving type sense amplifier connected to said match line, wherein a threshold voltage of each said selective transistor has a predetermined value incorporated during a fabrication process and a gate voltage $V_W$ of each of said selective transistor satisfies the following condition at the time of retrieval operation:

$$V_t \leq V_W \leq V_S + V_{t'}$$

where:
   $V_t$: threshold voltage of the selective transistor (at the time of 0 V substrate bias);
   $V_S$: potential of the match line at the time of retrieval operation;
   $V_{t'}$: threshold voltage of the selective transistor subjected to substrate bias at the time of retrieval operation.

2. A semiconductor integrated circuit as claimed in claim 1, wherein the voltage $V_t$ (at the time of 0 V substrate bias) at the value incorporated in said selective transistor is set higher than that of any peripheral circuit.

3. A semiconductor integrated circuit as claimed in claim 1, wherein said memory cells each comprises a nonvolatile memory element.

4. A semiconductor integrated circuit as claimed in claim 3, wherein said nonvolatile memory element is a MONOS-type nonvolatile memory element.

5. A semiconductor integrated circuit as claimed in claim 1, further comprising a plurality of retrieval memory word blocks, each of said blocks including a set of said first and second memory cells, said selective transistors and a selective word line connected to a gate electrode of each of said selective transistors for controlling said selective transistors, wherein said match line and said sense amplifier are commonly used for said plurality of retrieval memory word blocks.

6. A semiconductor integrated circuit comprising a first memory cell for defining the electrical connection or the nonconnection between a first data line and a match line, a second memory cell for defining the electrical nonconnection or the connection between a second data line and said match line, a selective transistor for making and breaking the connection between each of said first and said second data lines and said match line in accordance with the definition of the connections of said first and second memory cells, means for electrically connecting a selective word line connected to a gate electrode of said selective transistor to said match line, and means for making said selective word line afloat.

7. A semiconductor integrated circuit as claimed in claim 6, wherein a threshold voltage of said selective transistor has a predetermined value incorporated during a fabrication process.

8. A semiconductor integrated circuit as claimed in claim 6, wherein a gate voltage $V_W$ of said selective transistor satisfies the following conditions at the time of retrieval operation:

$$V_t \leq V_W \leq V_H + V_{t'}$$

where
$V_t$: threshold voltage of the selective transistor (at the time of 0 V substrate bias);
$V_H$: H (high) potential of the data line at the time of retrieval operation;
$V_{t'}$: threshold voltage of the selective transistor subjected to substrate bias at the time of retrieval operation.

9. A semiconductor integrated circuit as claimed in the claim 6, wherein the threshold voltage $V_t$ (at the time of 0 V substrate bias) at the value incorporated in said selective transistor is set higher than that of any peripheral circuit.

10. A semiconductor integrated circuit as claimed in claim 7, wherein said memory cells each comprises a nonvolatile memory element.

11. A semiconductor integrated circuit as claimed in claim 10, wherein said nonvolatile memory element is a MONOS-type nonvolatile memory element.

12. A semiconductor integrated circuit as claimed in claim 6, further comprising a plurality of retrieval memory word blocks, each of said blocks including a set of said first and second memory cells, said selective transistors and said selective word line for controlling said selective transistors, wherein said match line and a potential detecting means for detecting an electric potential of the match line are commonly used for said plurality of retrieval memory word blocks.

13. A semiconductor integrated circuit comprising:
    a first nonvolatile memory cell for defining the electrical connection or the nonconnection between a first data line and a match line;
    a second nonvolatile memory cell for defining the electrical nonconnection or the connection between a second data line and said match line;
    and a selective word line for controlling said first and second nonvolatile memory cells, said first and second nonvolatile memory cells and said selective word line being combined into a retrieval memory word block, wherein the voltage of each signal line and the threshold voltage of each nonvolatile memory cell are so arranged as to satisfy the following equations (I) and (II) simultaneously at the time of data retrieval operation:

$$V_W - V_H < V_{tL} < V_W - V_L < V_{tH} \quad \text{(I)}$$

$$V_W - V_S < V_{tL} \quad \text{(II)}$$

where $V_{tL}$: low threshold voltage of the nonvolatile memory cell;

$V_W$: potential of the selective word line at the time of retrieval operation;

$V_{tH}$: high threshold voltage of the nonvolatile memory cell;

$V_H$: H (high) potential of each of the data lines supplied with H (high) potential at the time of retrieval operation;

$V_L$: L (low) potential of each of the data lines supplied with L (low) potential at the time of retrieval operation;

$V_S$: potential of the match line at the time of retrieval operation.

14. A semiconductor integrated circuit as claimed in claim 13, wherein said nonvolatile memory cell is formed with a nonvolatile transistor having a threshold voltage satisfying said equations (I) and (II).

15. A semiconductor integrated circuit as claimed in claim 13, further comprising means for setting the voltages of each signal line and the threshold voltage of each nonvolatile memory cell at the time of retrieval operation so that the integrated circuit can satisfy said equations (I) and (II) simultaneously.

16. A semiconductor integrated circuit as claimed in claim 13, wherein said nonvolatile memory element is at least one selected from the group consisting of mask ROM, EPROM, EEPROM and UVEPROM.

17. A semiconductor integrated circuit as claimed in claim 13, wherein said match line and a potential detecting means for detecting an electric potential of the match line are commonly used for a plurality of said retrieval memory word blocks.

* * * * *